(12) United States Patent
Kong et al.

(10) Patent No.: US 7,173,871 B2
(45) Date of Patent: Feb. 6, 2007

(54) SEMICONDUCTOR MEMORY DEVICE AND METHOD OF OUTPUTTING DATA STROBE SIGNAL THEREOF

(75) Inventors: Eun-Youp Kong, Seoul (KR); Jun-Young Jeon, Seoul (KR); Jae-Hyeong Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 268 days.

(21) Appl. No.: 10/392,582

(22) Filed: Mar. 19, 2003

(65) Prior Publication Data

US 2003/0179627 A1     Sep. 25, 2003

(30) Foreign Application Priority Data

Mar. 20, 2002   (KR) ............................... 2002-15117

(51) Int. Cl.
  *G11C 17/18*   (2006.01)
  *G11C 8/00*    (2006.01)
(52) U.S. Cl. ................. 365/225.7; 365/230.03
(58) Field of Classification Search ........... 365/189.05, 365/230.08, 233, 52, 230.03, 230.06, 225.7, 365/200
  See application file for complete search history.

(56) References Cited

U.S. PATENT DOCUMENTS 6,388,935 B1 *   5/2002  Kawagoe et al. ........ 365/225.7
6,424,590 B1 *   7/2002  Taruishi et al. ........ 365/230.08
6,498,766 B2 *  12/2002  Lee et al. .................... 365/233
6,519,188 B2 *   2/2003  Ryoo et al. ............ 365/189.05
6,807,108 B2 *  10/2004  Maruyama et al. .... 365/189.05
6,819,602 B2 *  11/2004  Seo et al. .............. 365/189.05
6,819,626 B2 *  11/2004  Okuda et al. ................ 365/233

* cited by examiner

*Primary Examiner*—Trong Phan
(74) *Attorney, Agent, or Firm*—Marger Johnson & McCollom, P.C.

(57) ABSTRACT

A semiconductor memory device is disclosed. The device comprises at least one data input/output reference signal input and output pin and a plurality of integrated circuits, each with a data input/output reference signal input and output pad connected to the data input/output reference signal input and output pin. Each integrated circuit further comprises a data input/output reference signal input and output buffer for buffering a data input/output reference signal input from the data input/output reference signal input and output pad when data is input. This buffer also buffers an internally generated data input/output reference signal, and outputs the buffered signal when data is output. The internally generated data input/output reference signal output can be disabled on each integrated circuit in response to a control signal, thus allowing a single one of the plurality of integrated circuits to be selected to generate the reference signal.

7 Claims, 5 Drawing Sheets

SEMICONDUCTOR MEMORY DEVICE AND METHOD OF OUTPUTTING DATA STROBE SIGNAL THEREOF

BACKGROUND OF THE INVENTION

This application claims the priority of Korean Patent Application No. 2002-0015117, filed on Mar. 20, 2002, in the Korean Intellectual Property Office.

FIELD OF THE INVENTION

The present invention relates to a semiconductor memory device and more particularly to the semiconductor memory device comprising at least two integrated circuits in which data is input and output in association with a reference (called a data strobe signal) and a method for outputting the data strobe signal out of the semiconductor memory device.

DESCRIPTION OF RELATED ART

Generally, a double data rate (DDR) synchronous semiconductor memory device uses a data strobe signal as a reference signal to capture input data and output data. Accordingly, the data strobe signal is required to be generated in time for capturing the data.

In conventional semiconductor memory devices, one data strobe signal is generated for inputting and outputting four bits or eight bits of data with one clock cycle to and from the semiconductor memory device, so that the conventional semiconductor memory device has one data strobe signal pin.

Sometimes, the semiconductor memory device is formed by packaging two or more DDR synchronous semiconductor memory devices together. Each DDR synchronous semiconductor memory device is referred to hereinafter as an integrated circuit in the same package as a data strobe signal pad.

FIG. 1 illustrates a block diagram of a conventional semiconductor memory device 100 comprising first and second integrated circuits 110-1 and 110-2. The first and second integrated circuits include data strobe signal pads 12-1 and 12-2, data input and output pads 14-1 and 14-2, data strobe signal input and output buffers (DQSBs) 116-1 and 116-2, and data input and output buffers (DIOBs) 18-1 and 18-2, respectively.

The semiconductor memory device includes a data strobe signal (DQS) pin 11, which is commonly connected to the data strobe signal pads 12-1 and 12-2 formed in the first and second integrated circuits 110-1 and 110-2, respectively. The semiconductor memory device further includes a plurality of data input and output (DQ) pins 13-1 and 13-2, connected to respective data input and output pads 14-1 and 14-2 in the integrated circuits 110-1 and 110-2.

For write operations, the data input and output buffers 18-1 and 18-2 generate input data DI to be written into the integrated circuits 110-1 or 110-2 by buffering data DQ that is externally input respectively through the data input and output pins 13-1 and 13-2. For read operations, the data input and output buffers 18-1 and 18-2 generate the data DQ by buffering output data DO read respectively from the integrated circuits 110-1 and 110-2.

For write operations, the data strobe signal input/output buffers 116-1 and 116-2 each receive and buffer the data strobe signal DQS externally input through the external data strobe signal input and output pin 11 to generate input data strobe signal DSI for respective integrated circuits 110-1 and 110-2. For read operations, buffers 116-1 and 116-2 each receive and buffer output data strobe signal DSO internally generated to generate the data strobe signal DQS.

The input data strobe signals DSI generated by the data strobe signal input/output buffers 116-1 and 116-2 are input to the data input/output buffers 18-1 and 18-2 in the integrated circuits 110-1, 110-2, respectively. Each data strobe signal DSI is used as a reference signal for capturing the input data DI. In the same manner, the output data strobe signal DSO is used as a reference signal for capturing the output data DO.

Data input and output operation of the semiconductor memory device shown in FIG. 1 will be described below.

For inputting four-bit or eight-bit data to the semiconductor memory device 100, the data strobe signal DQS is input through the data strobe signal input pin 11 and at the same time four bits or eight bits of data DQ are input to the semiconductor memory device via the data input/output pins 13-1 and 13-2. Then, the data strobe signal input/output buffers 116-1 and 116-2 buffer the data strobe signal DQS, thereby generating the input data strobe signal DSI. The data input and output buffers 18-1 and 18-2 buffer the data DQ to be input to the semiconductor memory device, thereby generating the input data DI.

For outputting four bits or eight bits of data DQ from the semiconductor memory device, a data strobe signal DQS is required to be output from the semiconductor memory device. Thus, the data strobe signal input/output buffers 116-1 and 116-2 in the integrated circuits 110-1 and 110-2 buffer, respectively, the output data strobe signals DSO, which are internally generated, thereby generating the data strobe signals DQS to be output from the semiconductor memory device through the data strobe signal input/output pin 11. At the same time, the data input/output buffers 18-1 and 18-2 buffer the output data DO read from the integrated circuits 10-1 and 10-2, thereby generating the data DQ to be output through the data input and output pins 13-1 and 13-2.

Typically, the length of the signal line between the data strobe signal pad 12-1 in the integrated circuit 110-1 and the data strobe signal pin 11 is different from that between the data strobe signal pad 12-2 in the integrated circuit 110-2 and the data strobe signal pin 11. Further, the data strobe signal DSO internally generated in the integrated circuit 110-1 is not exactly synchronized with the data strobe signal DSO internally generated in the integrated circuit 110-2. As a result, the relative timing between the data strobe signals generated from the integrated circuits 110-1 and 110-2 is skewed. Accordingly, the data strobe signal DQS may not be synchronized to capture the data in time. That is, when the data is read out from the conventional semiconductor memory device shown in FIG. 1, even though two data strobe signals are generated from the two integrated circuits, only one data strobe signal may be output from the semiconductor memory device through the data strobe signal input and output pin 11 at a time. Accordingly, the timing for outputting the data strobe signal may not be synchronized with the timing for outputting the data.

SUMMARY OF THE INVENTION

In an effort to overcome the problems described above, in one embodiment of the present invention a semiconductor memory device having two, or more than two, integrated circuits in one package, is capable of eliminating skewing of data strobe signals.

In accordance with one aspect of the present invention, the present embodiments exemplify a semiconductor memory device comprising at least one data input/output reference signal input and output pin, and a plurality of integrated circuits, each integrated circuit having a data input/output reference signal input and output buffer with a selectable output disable capability, each such buffer connected to the data input/output reference signal input and output pin. In some embodiments, the selectable output disable capability is provided by a severable fuse on each integrated circuit that can be severed to disconnect the output buffer of the data input/output reference signal input and output buffer from the path to the data input/output reference signal input and output pin. In other embodiments, the selectable output disable capability is provided by a control circuit that can prevent an internally generated data input/output reference signal from activating the output buffer of the data input/output reference signal input and output buffer.

In another aspect of the present invention, integrated circuits for use in a semiconductor memory device such as just described are described. For instance, such an integrated circuit can comprise an output buffer to buffer an internally generated data input/output reference signal to be output when the integrated circuit outputs data, and means for disabling output of the internally generated data input/output reference signal such that the internally generated data input/output reference signal is not output when the integrated circuit outputs data. The disabling means are exemplified, e.g., by the selectable output disable capabilities described above.

In yet another aspect of the invention, the described embodiments provide methods of outputting, out of the semiconductor memory device, a data input/output reference signal, e.g., the data strobe signal generated from a DDR RAM. For instance, a method is disclosed for outputting a data input/output reference signal in a semiconductor memory device having at least one data input/output reference input and output pin and a plurality of integrated circuits connected to that pin, the method comprising controlling the integrated circuits such that when the semiconductor memory device is expected to output the data input/output reference signal, only one of the integrated circuits generates the data input/output reference signal.

BRIEF DESCRIPTION OF THE DRAWINGS

These and other features and advantages of the present invention will be readily apparent to those of ordinary skill in the art upon review of the detailed description that follows when taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, an example of which is illustrated in the accompanying drawings.

Figure 2:
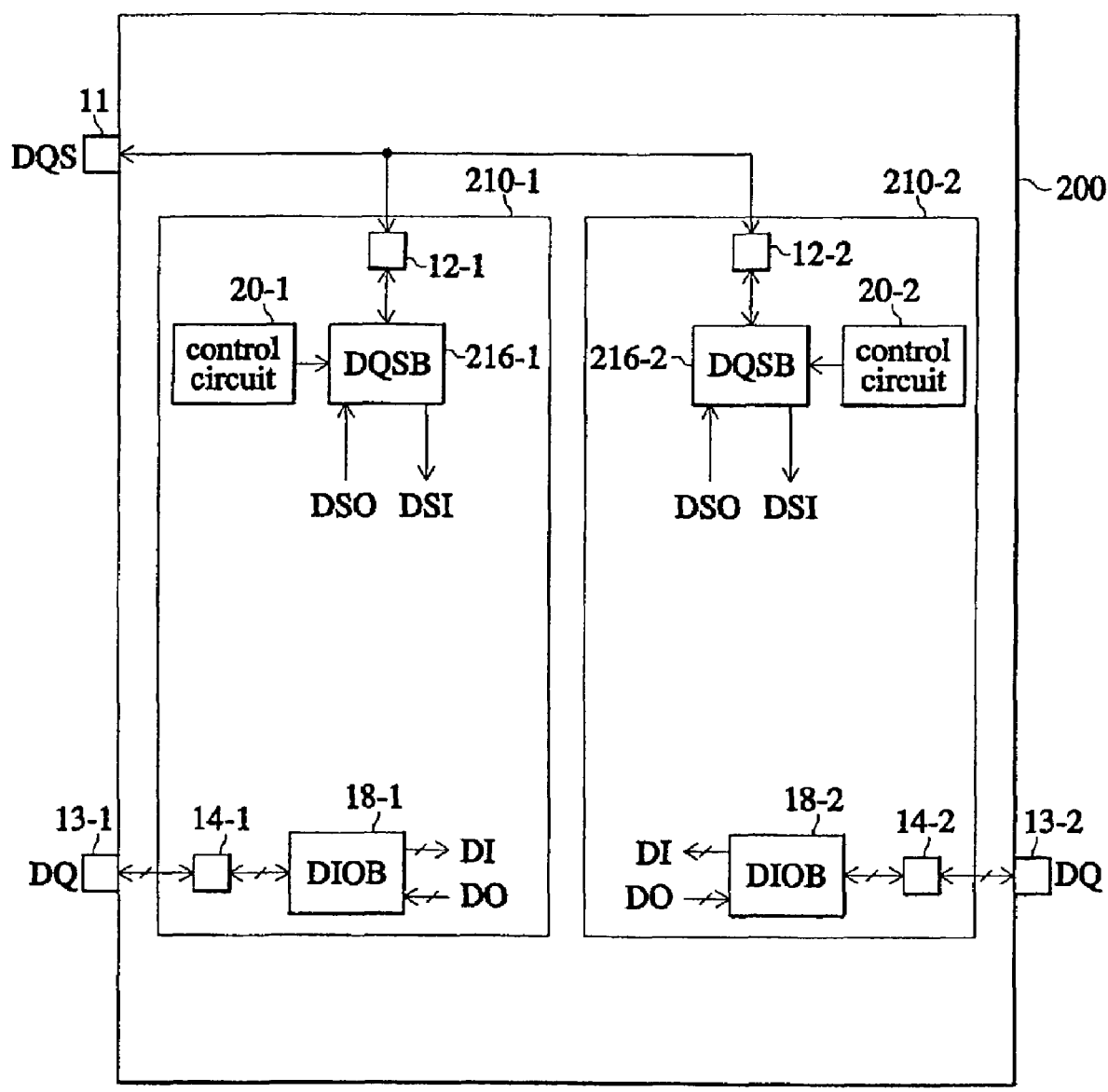
FIG. 2 illustrates a block diagram of a semiconductor memory device in accordance with the present invention.

FIG. 2 illustrates a block diagram of a semiconductor memory device 200 in accordance with an embodiment of the present invention. The semiconductor memory device includes: a first integrated circuit 210-1 and a second integrated circuit 210-2, each of which may be a synchronous DDR RAM; a data strobe signal input and output pin 11; and data input and output pins 13-1 and 13-2. The first and second integrated circuits 210-1 and 210-2 include data strobe signal pads 12-1 and 12-2, data strobe signal input and output buffers 216-1 and 216-2, control circuits 20-1 and 20-2, data input and output pads 14-1 and 14-2, and data input and output buffers 18-1 and 18-2, respectively. The data strobe signal input and output pin 11 is electrically and commonly connected to the data strobe signal input and output pads 12-1 and 12-2 in the first and second integrated circuits 210-1 and 210-2. The data input and output pins 13-1 and 13-2 are connected to the data input and output pads 14-1 and 14-2, respectively.

Figure 1:
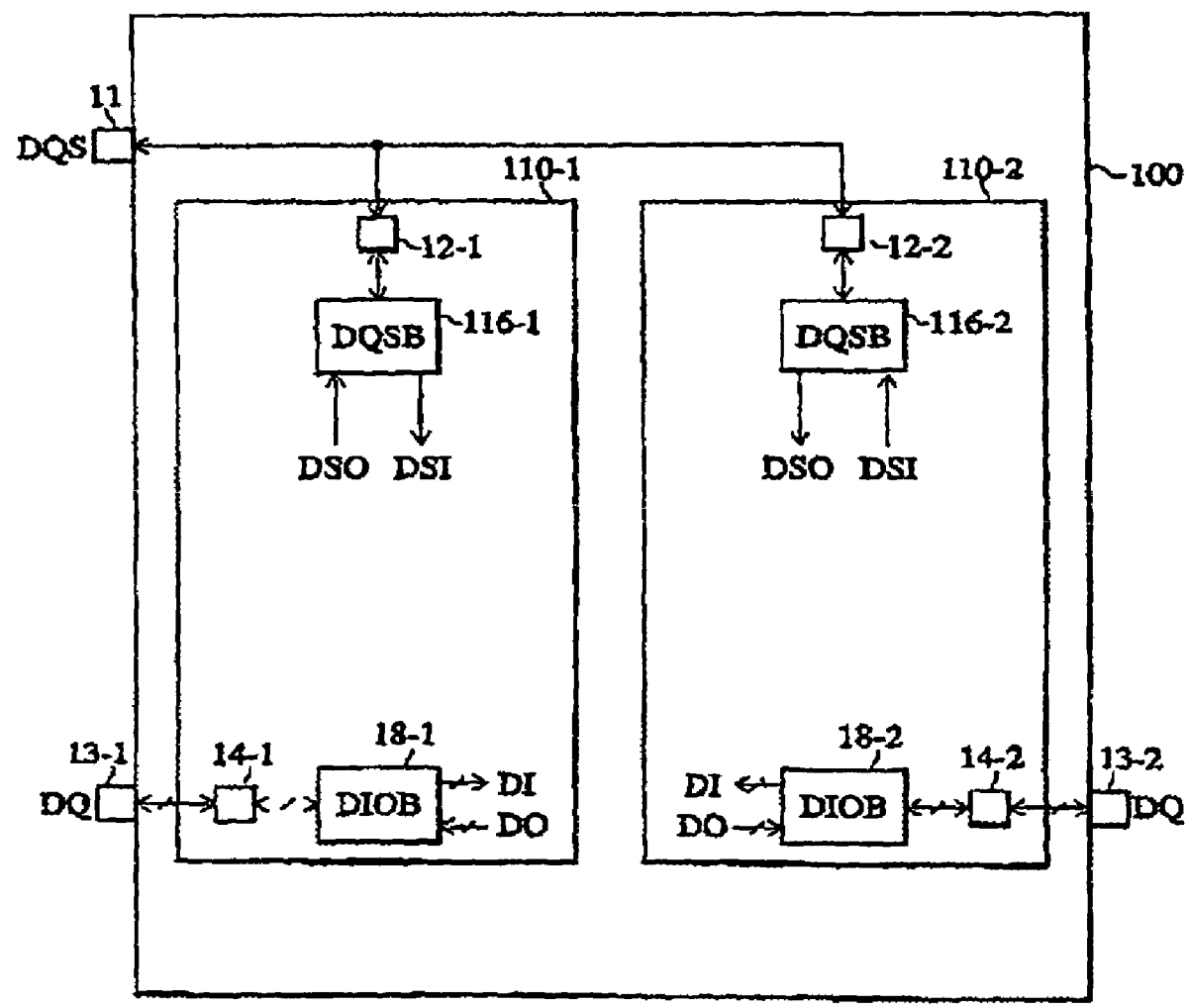
FIG. 1 illustrates a block diagram of a conventional semiconductor memory device.

The control circuits 20-1 and 20-2 provided in the semiconductor memory device shown in FIG. 2 are not present in the conventional semiconductor memory device shown in FIG. 1.

Functions and operations of each block with like reference in FIG. 1 and FIG. 2 are the same.

The control circuits 20-1 and 20-2 control the data strobe signal input and output buffers 216-1 and 216-2, respectively, thereby controlling enabling and disabling of the data strobe signals.

Semiconductor memory device 200 generates one data strobe signal DSQ by controlling the data strobe signal input and output buffers 216-1 and 216-2 using the control circuits 20-1 and 20-2.

For example, in one configuration, the data strobe signal generated under the control of the control circuit 20-1 from DQSB 216-1, in first integrated circuit 210-1, is output through the data strobe signal input and output pad 12-1 and the data strobe signal input and output pin 11 out of the semiconductor memory device. At the same time, control circuit 20-2 prevents DQSB 216-2 from outputting the data strobe signal generated from the second integrated circuit 210-2 to input and output pad 12-2.

Figure 3:
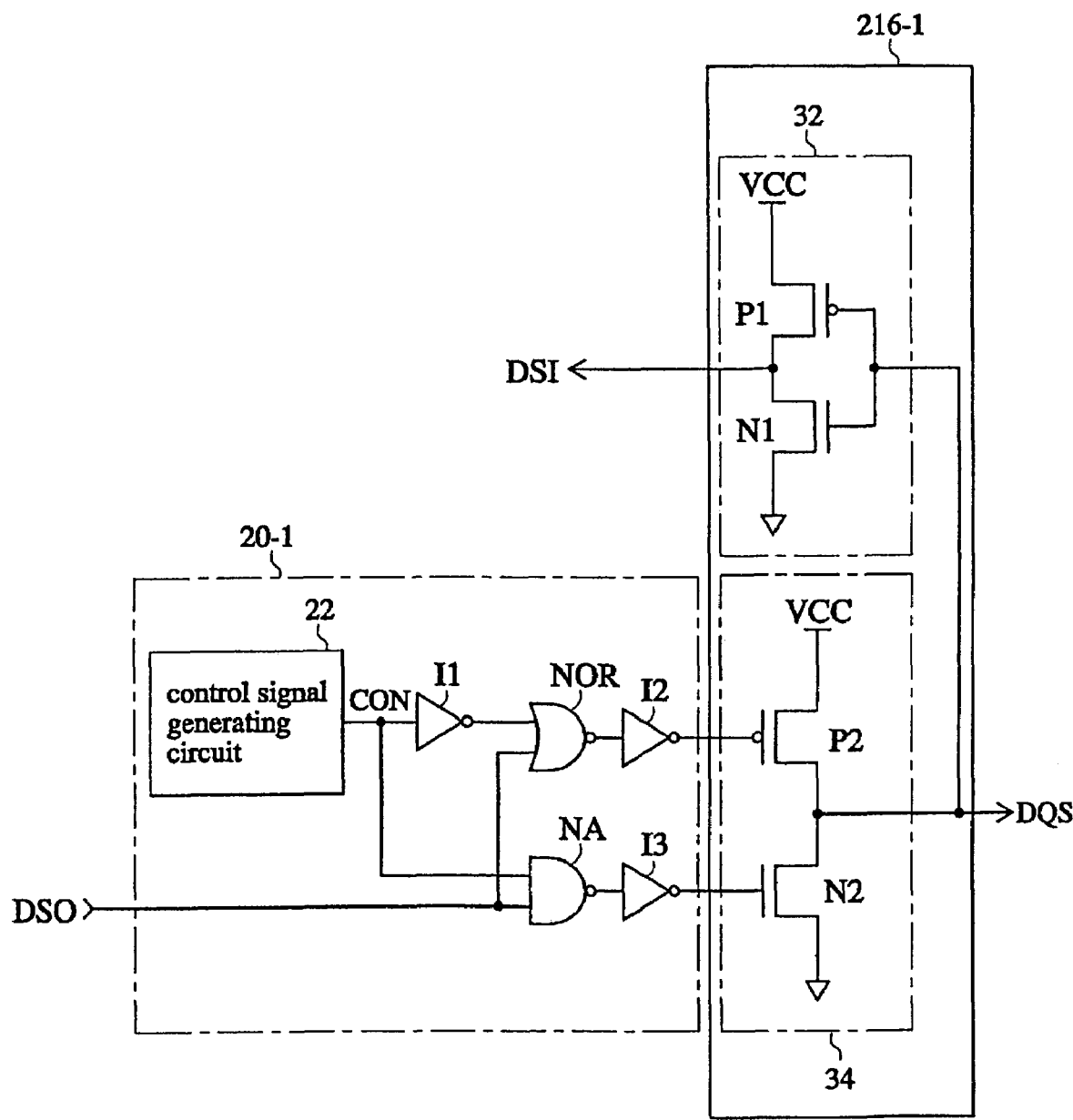
FIG. 3 illustrates circuit diagrams of a data strobe signal input and output buffer and a control circuit contained in the semiconductor memory device in accordance with the present invention.

FIG. 3 illustrates circuit diagrams of a data strobe signal input and output buffer 216-1 and a control circuit 20-1 in accordance with an embodiment of the present invention. DQSB 216-1 comprises a data strobe signal input buffer 32 and a data strobe signal output buffer 34. Control circuit 20-1 comprises a control signal generating circuit 22, inverters I1, I2 and I3, a NOR gate NOR and a NAND gate NA. The data strobe signal input buffer 32 comprises a PMOS transistor P1 and a NMOS transistor N1. The data strobe signal output buffer 34 comprises a PMOS transistor P2 and a NMOS transistor N2.

The data strobe signal input buffer 32 buffers the externally input data strobe signal DQS to generate a data strobe input signal DSI as an input to the integrated circuits.

Operation of the circuit in FIG. 3 is described below.

When a control signal CON output from the control signal generating circuit 22 is set to a logic "high" level and the data strobe output signal DSO has a logic "high" level, operation of the circuit in FIG. 3 is as follows:

The inverter I1 inverts the logic level of the control signal CON, thereby generating a signal of logic "low" level. A first circuit comprising the NOR gate NOR and inverter I2 generates a logic "high" level signal in response to a logic "high" level at the data strobe output signal DSO. A second circuit comprising the NAND gate NA and inverter I3 generates a logic "high" level signal in response to a logic "high" level at the data strobe output signal DSO and the control signal CON at a logic "high" level. Thus, the PMOS transistor P2 turns off and the NMOS transistor N2 turns on, thereby generating a data strobe signal DQS of logic "low" level.

When the control signal CON maintains a logic "high" level and the data strobe output signal DSO has logic "low" level, operation of the circuit in FIG. 3 is as follows:

The first circuit comprising the NOR gate NOR and the inverter I2 generates a logic "low" level signal in response to a logic "low" level at the output of the inverter I1 and a logic "low" level for the data strobe output signal DSO. The second circuit comprising the NAND gate NAND and the inverter I3 generates a logic "low" level signal in response to a logic "low" level at the data strobe output signal DSO. Then, the PMOS transistor P2 turns on and the NMOS transistor N2 turns off, thereby generating a data strobe signal DQS of logic "high" level.

Further, when the control signal CON is set to a logic "low" level and the data strobe output signal DSO has either a logic "low" level or a logic "high" level, operation of the circuit in FIG. 3 is as follows:

The inverter I1 inverts the logic level of the control signal CON and generates a logic "high" level signal. The first circuit comprising the NOR gate NOR and the inverter I2 generates a logic "high" level signal in response to logic "high" level on the data strobe output signal DSO. The second circuit comprising the NAND gate NA and the inverter I3 generates a logic "low" level signal in response to a logic "low" level on the control signal CON. Thus, the PMOS transistor P2 and the NMOS transistor N2 are turned off and the data strobe signal DQS is not generated.

Summarizing, when the control signal CON is set to a logic "high" level, logic "high" level or a logic "low" level for the data strobe signal DQS is generated depending upon the logic level of the data strobe output signal DSO. When the control signal CON is set to logic "low" level, however, the data strobe signal DQS is not generated regardless of the data strobe output signal DSO logic level.

Figure 4:
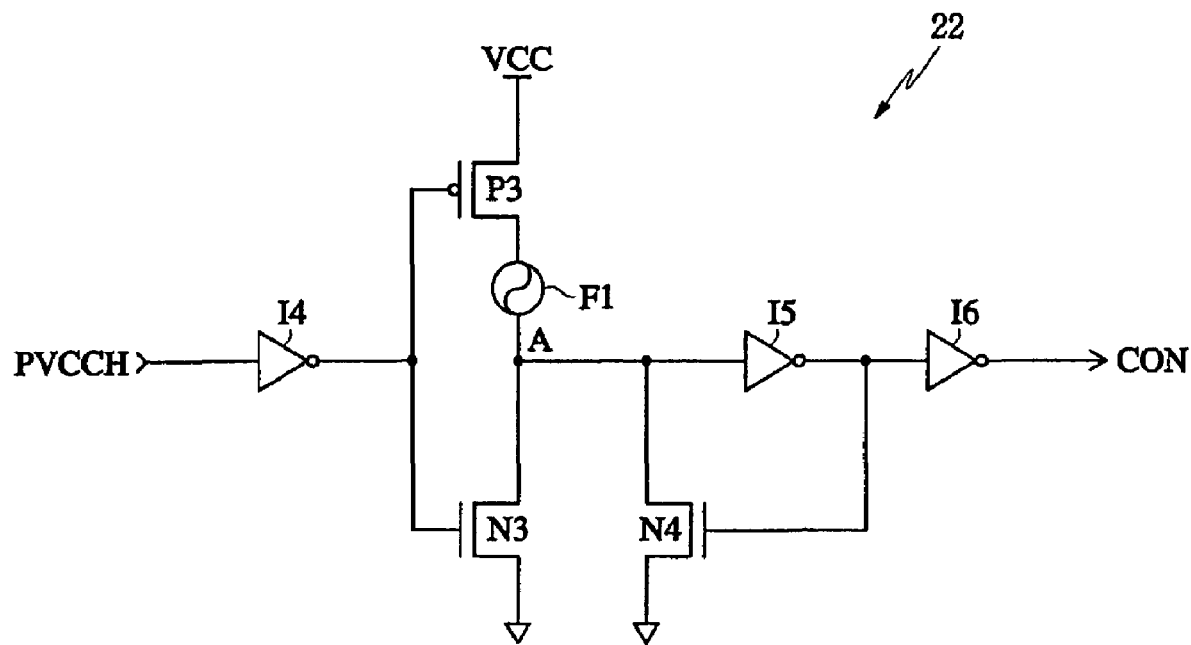
FIG. 4 illustrates a circuit diagram of a control signal generating circuit in accordance with one example of the present invention.

FIG. 4 illustrates a circuit diagram for the control signal generating circuit 22 shown in FIG. 3. The control signal generating circuit 22 comprises three inverters I4, I5 and I6, a PMOS transistor P3, two NMOS transistors N3 and N4, and a fuse F1.

Upon power-up, a power up signal PVCCH rises from a logic "low" level to a logic "high" level.

With the fuse F1 intact, the inverter I4 inverts the logic level of the power-up signal PVCCH, thereby generating an inverted signal. That is initially, when the power-up signal PVCCH has logic "low" level, the inverter generates a logic "high" level signal. The PMOS transistor P3 is turned off and the NMOS transistor N3 is turned on so as to transmit a logic "low" level to a node A. The inverters I5 and I6 buffer the logic "low" level signal transmitted via the node A and generate a control signal CON with a logic "low" level. At this time, the NMOS transistor N4 is turned on due to the logic "high" level output signal of the inverter I5, so that the node A maintains a logic "low" level. Then, when the power-up signal PVCCH transitions to a logic "high" level, the inverter I4 inverts the logic level of the power-up signal and generates a logic "high" level signal. Thus, the PMOS transistor P3 turns on and the NMOS transistor N3 turns off, so as to transmit the logic "high" level to node A. The inverters I5 and I6 buffer the logic "high" level signal transmitted from the node A and generate a control signal of logic "high" level.

With the fuse F1 cut, when the power-up signal PVCCH has a logic "low" level, the inverter I4 inverts the logic level of the power-up signal PVCCH and generates a logic "high" level. The PMOS transistor P3 is turned off and the NMOS transistor N3 is turned on to transmit a logic "low" level to node A. Thus the control signal CON with a logic "low" level is generated by the control signal generating circuit 22. When the power-up signal PVCCH transitions to logic "high" level, however, the inverter I4 inverts the logic level of the power-up signal PVCCH and transmits a logic "low" level to P3 and N3, turning on PMOS transistor P3. At this time, however, the node A maintains the logic "low" level because the fuse F is cut. Accordingly, the control signal CON maintains a logic "low" level with the fuse cut.

Figure 5:
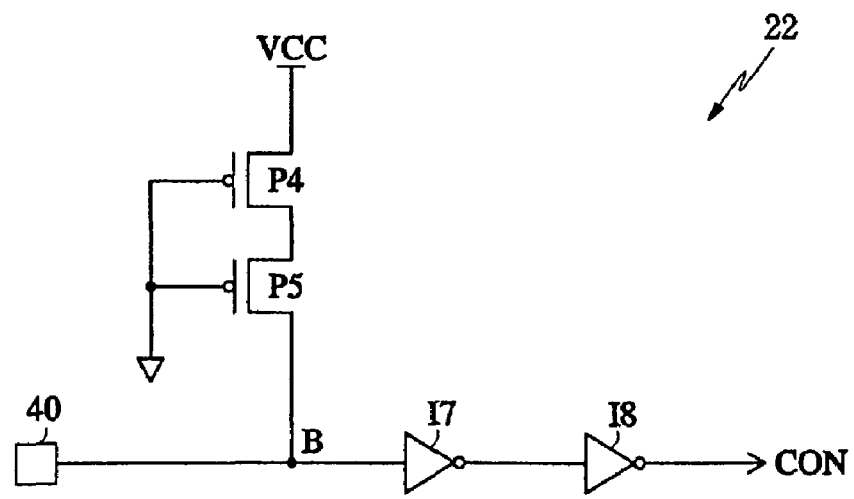
FIG. 5 illustrate a circuit diagram of a control signal generating circuit in accordance with another example of the present invention.

FIG. 5 illustrates a circuit diagram for the control signal generating circuit in accordance with another example of the present invention. The control signal generating circuit comprises a pad 40, two PMOS transistors P4 and P5 and inverters I7 and I8.

Operation of the circuit in FIG. 5 will be described below.

When the pad 40 is open, the PMOS transistors P4 and P5 are turned on, thereby transmitting a power supply voltage Vcc to a node B. The inverters I7 and I8 buffer the power supply voltage at node B and generate the control signal CON with a logic "high" level.

When the pad 40 is connected to a ground voltage, the node B is pulled to the ground voltage. Inverters I7 and I8 buffer the ground voltage at node B and generate the control signal CON with the logic "low" level.

That is, with the pad 40 being open, control signal CON is set to a logic "high" level; with the pad 40 connected to ground voltage, control signal CON is set to a logic "low" level.

Figure 6:
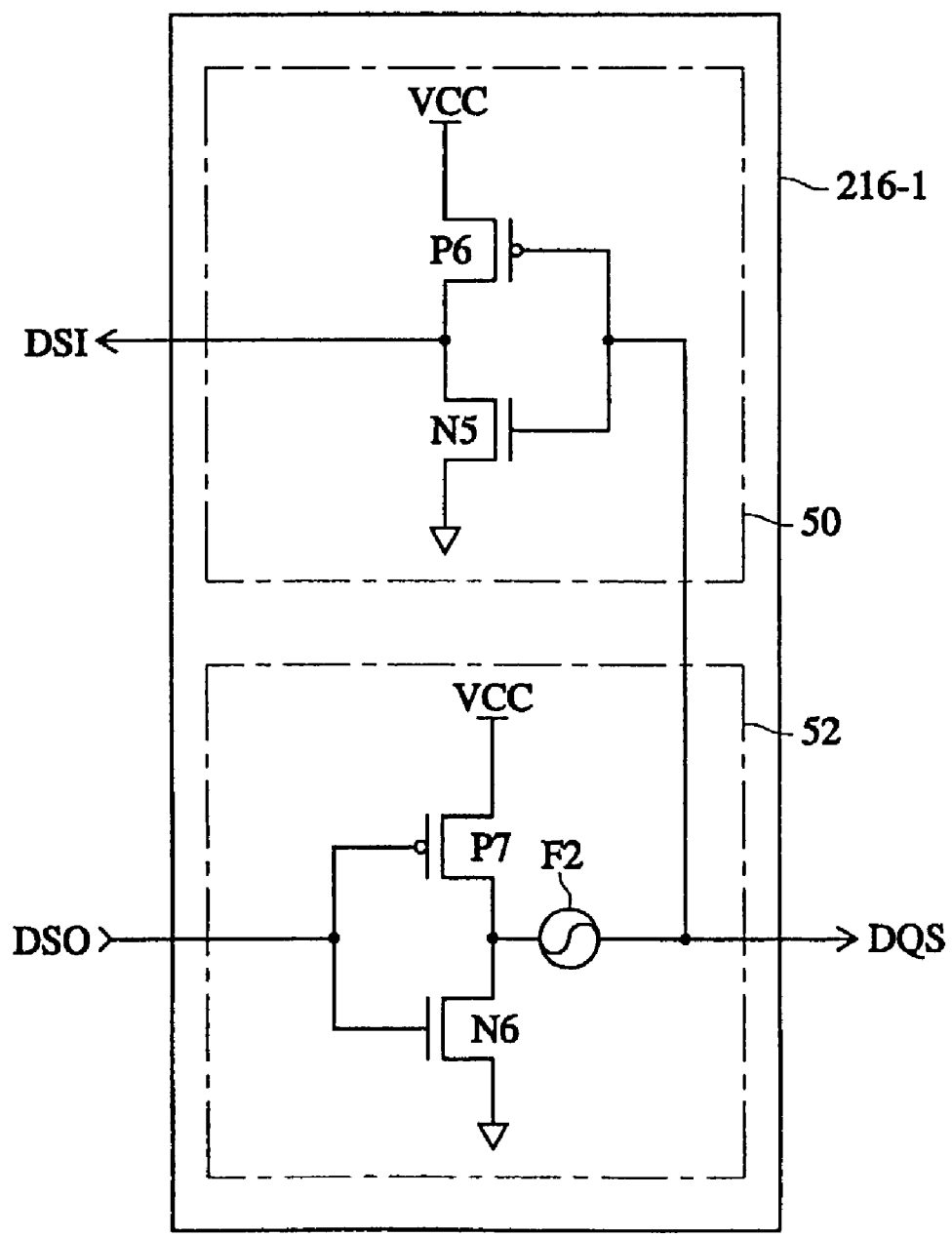
FIG. 6 illustrates a circuit diagram of a data strobe signal input and output buffer in accordance with the present invention.

FIG. 6 illustrates a circuit diagram for a data strobe signal input and output buffer 216-1 in accordance with another example of the present invention. The data strobe signal input buffer 50 comprises a PMOS transistor P6 and a NMOS transistor N5, and the data strobe signal output buffer 52 comprises a PMOS transistor P7, a NMOS transistor N6, and a fuse F2.

Operation of the data strobe signal input and output buffer shown in FIG. 6 will be described below.

The data strobe signal input buffer 50 buffers the externally input data strobe signal DQS to generate a data strobe input signal DSI as an input to the integrated circuits.

When the fuse F2 is intact, the data strobe signal output buffer 52 buffers the internally generated data strobe output signal DSO to generate the data strobe signal DQS. When the fuse F2 is cut, the data strobe signal DQS is not generated.

The data strobe signal input and output buffer shown in FIG. 6 may control enabling and disabling of the data strobe signal without additional control circuits 20-1 and 20-2.

As illustrated above, the present invention provides a semiconductor memory device capable of generating and outputting, from one of several integrated circuits, a data strobe signal while disabling the other data strobe signals output from the other integrated circuits contained in the semiconductor memory device. This single data strobe signal is output through the data strobe signal input and output pin of the semiconductor memory device.

Although the description above relates to a semiconductor memory device containing two integrated circuit in one package, the present invention is also applicable to a semiconductor memory device having more than two integrated circuits in the same package.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device comprising:
    at least one data input/output reference signal input and output pin; and
    a plurality of integrated circuits, each integrated circuit having a data input/output reference signal input and output buffer with a selectable output disable capability, each such buffer connected to the data input/output reference signal input and output pin, wherein each such buffer comprises an output buffer having an output connected through a fuse to the data input/output reference signal input and output pin, wherein the selectable output disable capability on each integrated circuit has a disable state that depends on whether the fuse is cut or intact, wherein the fuses on all but one of the integrated circuits are set to force the disable state on their respective integrated circuits.

2. A semiconductor memory device comprising:
    at least one data input/output reference signal input and output pin; and
    a plurality of integrated circuits, each integrated circuit having a data input/output reference signal input and output buffer with a selectable output disable capability in response to a control signal and a control circuit generating the control signal, each such buffer connected to the data input/output reference signal input and output pin, wherein on each integrated circuit, the data input/output reference signal input and output buffer comprises an output buffer, wherein the output buffer buffers an internally generated data output reference signal to output it to the data input/output reference signal input and output pin depending on a state of the control signal, and wherein the output buffer on one of the integrated circuits generates data output reference signal.
    wherein on each integrated circuit the output buffer includes:
    a first pull-up transistor for pulling up the data output reference signal in response to a first drive signal generated by combining the control signal and the internally generated data input/output reference signal; and
    a first pull-down transistor for pulling down the data output reference signal in response to a second drive signal generated by combining the control signal and the internally generated data input/output reference signal.

3. The semiconductor memory device of claim 2, wherein the control circuit comprises a control signal generating circuit generating the control signal, and a drive signal generating means for turning off the first pull-up transistor and the first pull-down transistor by setting the first and second drive signals to turn off the first pull-up transistor and first pull-down transistors in response to a first state of the control signal, and outputting the internally generated data output reference signal as the first and second drive signals in response to a second state of the control signal.

4. The semiconductor memory device of claim 3, the control signal generating circuit comprising:
    a first inverter to invert a logic level of a power-up signal;
    a second pull-up transistor connected between a power supply voltage and a first node to pull up the first node in response to an output signal of the first inverter;
    a fuse connected between the first node and a second node;
    a second pull-down transistor connected between the second node and a ground voltage to pull down the second node in response to the output signal of the first inverter;
    second and third inverters connected in series to buffer the signal appearing at the second node and generate the control signal; and
    a third pull-down transistor connected between the second node and the ground voltage to pull down the second node in response to an output of the second inverter.

5. The semiconductor memory device according to claim 4, wherein the power-up signal transitions from the first state to the second state upon power-up of the semiconductor memory device, and wherein the first state is a logic low level and the second state is a logic high level.

6. The semiconductor memory device of claim 3, wherein the control signal generating circuit includes:
    a pad;
    one or more pull-up transistors connected between a power supply voltage and the pad; and
    buffer circuitry to buffer a signal appearing at the pad and to generate an output disable control signal.

7. The semiconductor memory device of claim 6, wherein:
    the second state of the control signal is attained on at least one of the integrated circuits by externally floating the pad on that integrated circuit or connecting the pad on that integrated circuit to the power supply voltage; and
    the first state of the control signal is attained on at least one other of the integrated circuits by connecting the pad on that other integrated circuit to a ground voltage.

* * * * *

UNITED STATES PATENT AND TRADEMARK OFFICE
CERTIFICATE OF CORRECTION

| | |
|---|---|
| PATENT NO. | : 7,173,871 B2 |
| APPLICATION NO. | : 10/392582 |
| DATED | : February 6, 2007 |
| INVENTOR(S) | : Eun-Youp Kong et al. |

Page 1 of 1

It is certified that error appears in the above-identified patent and that said Letters Patent is hereby corrected as shown below:

Column 7, line 50, the words "generates data" should read -- generates a data --;
Column 7, line 51, the word "signal." should read -- signal, --.

Signed and Sealed this

Second Day of September, 2008

JON W. DUDAS
*Director of the United States Patent and Trademark Office*